(12) United States Patent
Wu et al.

(10) Patent No.: US 12,317,543 B2
(45) Date of Patent: May 27, 2025

(54) MOISTURE BARRIER FILM HAVING LOW REFRACTION INDEX AND LOW WATER VAPOR TRANSMISSION RATE

(71) Applicant: Applied Materials, Inc., Santa Clara, CA (US)

(72) Inventors: Wen-Hao Wu, San Jose, CA (US); Jriyan Jerry Chen, Campbell, CA (US); Dong Kil Yim, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 759 days.

(21) Appl. No.: 17/604,503

(22) PCT Filed: Jul. 10, 2019

(86) PCT No.: PCT/US2019/041163
§ 371 (c)(1),
(2) Date: Oct. 18, 2021

(87) PCT Pub. No.: WO2020/219087
PCT Pub. Date: Oct. 29, 2020

(65) Prior Publication Data
US 2022/0209188 A1 Jun. 30, 2022

Related U.S. Application Data

(60) Provisional application No. 62/838,883, filed on Apr. 25, 2019.

(51) Int. Cl.
*H10D 30/67* (2025.01)
*H10K 50/844* (2023.01)
(Continued)

(52) U.S. Cl.
CPC ....... *H10D 30/6755* (2025.01); *H10K 50/844* (2023.02); *H10K 59/00* (2023.02); *H10K 59/8731* (2023.02)

(58) Field of Classification Search
None
See application file for complete search history.

(56) References Cited

U.S. PATENT DOCUMENTS 5,554,570 A 9/1996 Maeda et al.
8,906,813 B2 12/2014 Won et al.
(Continued)

FOREIGN PATENT DOCUMENTS

CN 104115300 A 10/2014
CN 104584256 A 4/2015
(Continued)

OTHER PUBLICATIONS

Serényi et al. "Refractive index of sputtered silicon oxynitride layers for antireflection coating," Vacuum, 2001, vol. 61, No. 2-4, pp. 245-249, DOI: 10.1016/S0042-207X(01)00124-5.
(Continued)

*Primary Examiner* — Alexander G Ghyka
(74) *Attorney, Agent, or Firm* — Patterson + Sheridan, LLP

(57) ABSTRACT

Embodiments of the present disclosure generally relate to an organic light emitting diode device, and more particularly, to moisture barrier films utilized in an OLED device. The OLED device comprises a thin film encapsulation structure and/or a thin film transistor. A moisture barrier film is used as a first barrier layer in the thin film encapsulation structure and as a passivation layer and/or a gate insulating layer in the thin film transistor. The moisture barrier film comprises a silicon oxynitride material having a low refractive index of less than about 1.5, a low water vapor transmission rate of
(Continued)

less than about $5.0 \times 10^{-5}$ g/m²/day, and low hydrogen content of less than about 8%.

19 Claims, 3 Drawing Sheets

(51) Int. Cl.
*H10K 59/00* (2023.01)
*H10K 59/80* (2023.01)

(56) References Cited

U.S. PATENT DOCUMENTS

| | | | |
|---|---|---|---|
| 9,293,706 | B2 | 3/2016 | Haas et al. |
| 9,337,051 | B2 | 5/2016 | Mebarki et al. |
| 9,478,421 | B2 | 10/2016 | Bencher et al. |
| 2003/0143319 | A1 | 7/2003 | Park et al. |
| 2011/0097533 | A1 | 4/2011 | Li et al. |
| 2013/0334511 | A1 | 12/2013 | Savas et al. |
| 2014/0246655 | A1 | 9/2014 | Chen |
| 2014/0256070 | A1 | 9/2014 | Chen et al. |
| 2014/0306218 | A1* | 10/2014 | Koezuka .............. H01L 27/1248 257/43 |
| 2015/0084035 | A1 | 3/2015 | Kim et al. |
| 2015/0368801 | A1 | 12/2015 | Xue et al. |
| 2016/0190511 | A1 | 6/2016 | Choi et al. |
| 2016/0336542 | A1* | 11/2016 | Chen ................. H01L 21/67207 |
| 2017/0104048 | A1 | 4/2017 | Chung et al. |
| 2019/0097175 | A1 | 3/2019 | Wu et al. |
| 2019/0371918 | A1* | 12/2019 | Wang ................ H01L 21/02211 |

FOREIGN PATENT DOCUMENTS

| | | | |
|---|---|---|---|
| CN | 105190932 | A | 12/2015 |
| CN | 105826485 | A | 8/2016 |
| CN | 107636793 | A | 1/2018 |
| JP | H07211712 | A | 8/1995 |
| JP | 2011-258943 | A | 12/2011 |
| JP | 2013-232279 | A | 11/2013 |
| JP | 2015-024536 | A | 2/2015 |
| JP | 2015-228491 | A | 12/2015 |
| JP | 6442117 | B1 | 12/2018 |
| KR | 20150126558 | A | 11/2015 |
| KR | 20170043726 | A | 4/2017 |
| KR | 10-2018-0003287 | A | 1/2018 |
| KR | 10-19420420000 | | 1/2019 |
| TW | 201417224 | A | 5/2014 |
| TW | 201523867 | A | 6/2015 |
| TW | 201609428 | A | 3/2016 |
| TW | 201628230 | A | 8/2016 |
| TW | 201810762 | A | 3/2018 |
| WO | 2018130288 | A1 | 7/2018 |

OTHER PUBLICATIONS

International Search Report and Written Opinion in related application PCT/US2019/041163 dated Jan. 22, 2020.

Japanese Office Action Dated Feb. 21, 2023 for Application No. 2021-540804.

Korean Office Action dated Apr. 9, 2024 for Application No. 10-2021-7038267.

Japanese Office Action dated Feb. 14, 2023 for Application No. 2021-562325.

Chinese Office Action dated Aug. 25, 2023; CN patent application No. 2019800947356.

Taiwanese Notice of Allowance and Issue Fee for Application No. 110149730.

Chinese Office Action Dated May 10, 2024 re: Chinese Application No. 201980083749.8.

* cited by examiner

MOISTURE BARRIER FILM HAVING LOW REFRACTION INDEX AND LOW WATER VAPOR TRANSMISSION RATE

BACKGROUND

Field

Embodiments of the present disclosure generally relate to an organic light emitting diode (OLED) device, and more particularly, to moisture barrier films utilized in an OLED device.

Description of the Related Art

An OLED structure is used in the manufacture of television screens, computer monitors, mobile phones, other hand-held devices, etc. for displaying information. OLED displays have gained significant interest recently in display applications due to their faster response time, larger viewing angles, higher contrast, lighter weight, low power, and amenability to flexible substrates, such as compared to liquid crystal displays (LCD).

OLED structures may have a limited lifetime, characterized by a decrease in electroluminescence efficiency and an increase in drive voltage. A main reason for the degradation of OLED structures is the formation of non-emissive dark spots due to moisture or oxygen ingress. For this reason, OLED structures are typically encapsulated by an organic layer sandwiched between inorganic layers, where the inorganic layers act as moisture barrier layers. However, such an encapsulation structure may cause interference between each of the layers, resulting in an optical loss of about 30% or greater.

Therefore, there is a need for an improved encapsulation structure for an OLED structure.

SUMMARY

Embodiments of the present disclosure generally relate to an organic light emitting diode device, and more particularly, to moisture barrier films utilized in an OLED device. The OLED device comprises a thin film encapsulation structure and/or a thin film transistor. A moisture barrier film is used as a first barrier layer in the thin film encapsulation structure and as a passivation layer and/or a gate insulating layer in the thin film transistor. The moisture barrier film comprises a silicon oxynitride material having a low refractive index of less than about 1.5, a low water vapor transmission rate of less than about $5.0 \times 10^{-5}$ g/m$^2$/day, and low hydrogen content of less than about 8%.

In one embodiment, a thin film encapsulation structure comprises a first barrier layer, the first barrier layer comprising a silicon oxynitride material having a refractive index of about 1.46 to about 1.48, a water vapor transmission rate of less than about $5.0 \times 10^{-5}$ g/m$^2$/day, and a hydrogen content of less than about 8%. A buffer layer is disposed on the first barrier layer, and a second barrier layer is disposed on the buffer layer.

In another embodiment, a thin film transistor comprises a gate electrode, a gate insulating layer disposed over the gate electrode, the gate insulating layer comprising a silicon oxynitride material having a refractive index of about 1.46 to about 1.48, a water vapor transmission rate of less than about $5.0 \times 10^{-5}$ g/m$^2$/day, and a hydrogen content of less than about 6%. A semiconductor layer is disposed over the gate insulating layer, a drain electrode is disposed over the semiconductor layer, a source electrode is disposed adjacent to the drain electrode, and a passivation layer is disposed over the drain electrode, the source electrode, and the semiconductor layer.

In yet another embodiment, a display device comprises a light emitting device, a capping layer disposed over the light emitting device, and a thin film encapsulation structure disposed over the capping layer. The thin film encapsulation structure comprises a first barrier layer disposed over the capping layer, the first barrier layer comprising a silicon oxynitride material having a refractive index of about 1.46 to about 1.48, a water vapor transmission rate of less than about $5.0 \times 10^{-5}$ g/m$^2$/day, and a hydrogen content of less than about 8%. A buffer layer is disposed on the first barrier layer, and a second barrier layer is disposed on the buffer layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to an organic light emitting diode device, and more particularly, to moisture barrier films utilized in an OLED device. The OLED device comprises a thin film encapsulation structure and/or a thin film transistor. A moisture barrier film is used as a first barrier layer in the thin film encapsulation structure and as a passivation layer and/or a gate insulating layer in the thin film transistor. The moisture barrier film comprises a silicon oxynitride material having a low refractive index of less than about 1.5, a low water vapor transmission rate of less than about $5.0 \times 10^{-5}$ g/m$^2$/day, and low hydrogen content of less than about 8%.

Figure 1:
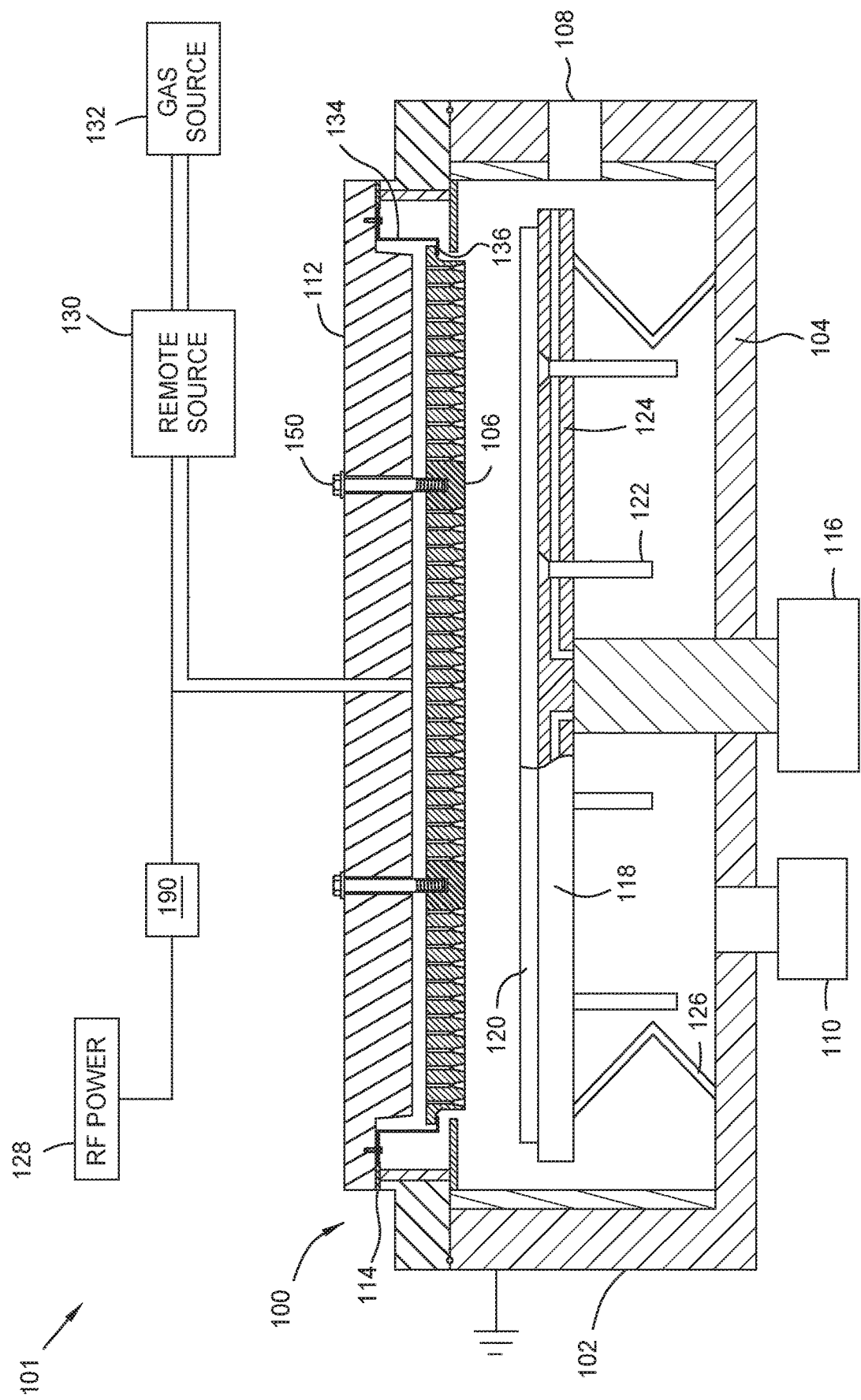
FIG. 1 is a schematic, cross sectional view of a plasma enhanced chemical vapor deposition apparatus, according to one embodiment.

FIG. 1 is a schematic, cross sectional view of a plasma enhanced chemical vapor deposition (PECVD) apparatus 101 that may be used to perform the operations described herein. The PECVD apparatus 101 includes a chamber 100 in which one or more films may be deposited onto a substrate 120. The chamber 100 generally includes walls 102, a bottom 104, and a showerhead 106, which collectively define a process volume. The process volume may be a vacuum environment. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move the substrate 120 to and from the substrate receiving surface. The substrate support 118 may also include heating and/or cooling elements 124 to maintain the substrate support 118 at a desired temperature. The substrate support 118 may also include RF return straps 126 to provide an RF return path at the periphery of the substrate support 118.

The showerhead 106 is coupled to a backing plate 112 by a fastening mechanism 150. The showerhead 106 may be coupled to the backing plate 112 by one or more fastening mechanisms 150 to help prevent sag and/or control the straightness/curvature of the showerhead 106.

A gas source 132 is coupled to the backing plate 112 to provide gas through gas passages in the showerhead 106 to a processing area between the showerhead 106 and the substrate 120. A vacuum pump 110 is coupled to the chamber 100 to maintain the process volume at a desired pressure. An RF source 128 is coupled through a match network 190 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 100 to form the vacuum environment.

Figure 2:
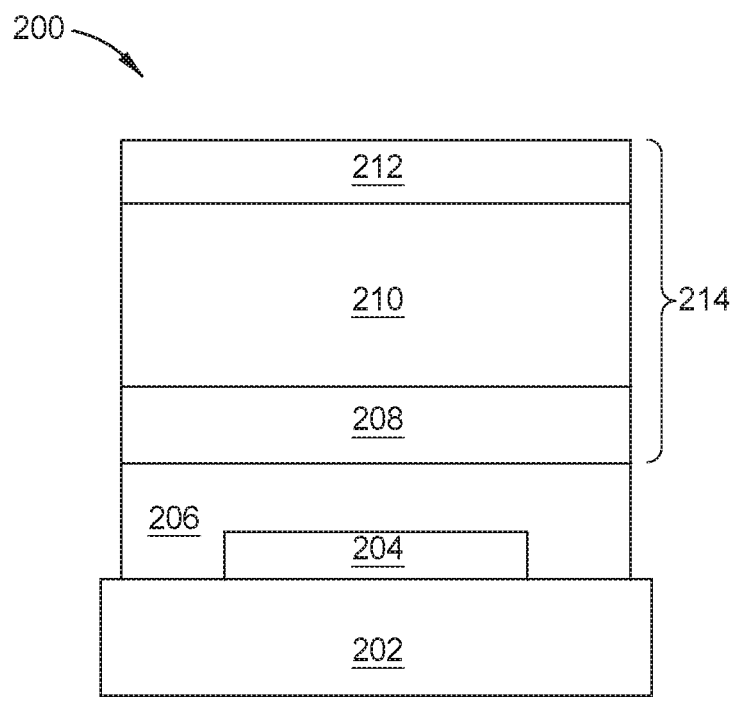
FIG. 2 is a schematic, cross sectional view of a display device having a thin film encapsulation structure disposed thereon, according to one embodiment.

FIG. 2 is a schematic, cross sectional view of a display device 200 having a thin film encapsulation (TFE) structure 214 disposed thereon, according to one embodiment. The display device 200 comprises a substrate 202. The substrate 202 may be made of a silicon-containing material, glass, polyimide, or plastic, such as polyethyleneterephthalate (PET) or polyethyleneterephthalate (PEN). A light emitting device 204 is disposed on the substrate 202. The light emitting device 204 may be an OLED structure or a quantum-dot structure. A contact layer (not shown) may be disposed between the light emitting device 204 and the substrate 202, and the contact layer is in contact with the substrate 202 and the light emitting device 204.

A capping layer 206 is disposed over the light emitting device 204 and the substrate 202. The capping layer 206 may have a refractive index of about 1.7 to about 1.8. A thin metal layer (not shown) may be disposed over the capping layer 206. A first barrier layer 208 is disposed on the capping layer 206 or the thin metal layer. A buffer layer 210 is disposed on the first barrier layer 208. A second barrier layer 212 is disposed on the buffer layer 210. The first barrier layer 208, the buffer layer 210, and the second barrier layer 212 comprise the TFE structure 214. The first barrier layer 208 and the second barrier layer 212 are moisture barrier films or layers.

The TFE structure 214 may have a thickness of about 2 μm to about 10 μm, such as about 4 μm. The buffer layer 210 has a thickness ranging from about 2 μm to about 5 μm. The first barrier layer 208 and the second barrier layer 212 may each have a thickness of about 0.5 μm to about 3 μm. For example, the first barrier layer 208 and the second barrier layer 212 may each have a thickness of about 1 μm, and the buffer layer 210 may have a thickness of about 2 μm. The first barrier layer 208 and the second barrier layer 212 may comprise the same material, or first barrier layer 208 and the second barrier layer 212 may comprise different materials. Additionally, the first barrier layer 208 and the second barrier layer 212 may have the same thickness, or the first barrier layer 208 and the second barrier layer 212 may have different thicknesses.

The buffer layer 210 may comprise an organic material having a refractive index of about 1.5. The buffer layer 210 may comprise organosilicon compounds, such as plasma-polymerized hexamethyldisiloxane (pp-HMDSO), fluorinated plasma-polymerized hexamethyldisiloxane (pp-HMDSO:F), and hexamethyldisilazane (HMDSN). Alternatively, the buffer layer 210 may be a polymer material composed by hydrocarbon compounds. The polymer material may have a formula $C_xH_yO_z$, wherein x, y and z are integers. In one embodiment, the buffer layer 210 may be selected from a group consisting of polyacrylate, parylene, polyimides, polytetrafluoroethylene, copolymer of fluorinated ethylene propylene, perfluoroalkoxy copolymer resin, copolymer of ethylene and tetrafluoroethylene, parylene. In one specific example, the buffer layer 210 is polyacrylate or parylene.

The first barrier layer 208 is comprised of a material comprising silicon oxynitride (SiON), The SiON material of the first barrier layer 108 has a refractive index at 632 nm of less than about 1.5, such as about 1.46 to about 1.48, and a water vapor transmission rate (WVTR) of less than about $5.0 \times 10^{-5}$ g/m$^2$/day at 40 degrees Celsius and a relative humidity of 100%. The SiON material of the first buffer layer 108 has a composition by x-ray photoelectron spectroscopy (XPS) of about 1.70 to about 2.15 of O/Si and about 0.01 to about 0.05 of N/Si. The SiON material of the first barrier layer 208 further has a density by XPS of about 2.15 g/cm$^3$ to about 2.20 g/cm$^3$, such as about 2.18 g/cm$^3$. The SiON material of the first barrier layer 208 has a composition by hydrogen forward scattering (HFS) of hydrogen (H$_2$) of about less than 8%. The SiON material of the first barrier layer 208 has a Si—O—Si peak position of about 1050 cm$^{-1}$ to about 1080 cm$^{-1}$ when measured by Fourier-transform infrared spectroscopy (FTIR). Additionally, the SiON material of the first barrier layer 208 has a thickness change percentage of about 104% to about 106% at 85 degrees Celsius and a relative humidity of 85% (i.e., saturated). In some embodiments, the second barrier layer 212 may comprise the same material as the first barrier layer 208 (i.e., the SiON film having the above described properties and composition).

Each layer of the TFE structure 214 may be deposited using a PECVD process and apparatus, such as the PECVD apparatus 101 of FIG. 1. In some embodiments, each layer of the TFE structure 214 may be deposited using a chemical vapor deposition (CVD) process and apparatus, or an atomic layer deposition (ALD) process and apparatus. Each layer of the TFE structure 214 may be deposited in a single PECVD chamber, such as the chamber 100 of FIG. 1. Purging of the PECVD chamber may be performed between cycles to minimize the risk of contamination. The single chamber process is advantageous in reducing cycle times as well as reducing the number of chambers (and equipment costs) of using a multiple chamber process.

In one embodiment, the TFE structure 214 is formed by placing the substrate 202 including the light emitting device 204 into the chamber, such as the chamber 100 of FIG. 1. The capping layer 206 may be deposited on the light emitting device 204 in the PECVD chamber, or the capping layer 206 may already be deposited on the light emitting device when placed into the chamber. The first barrier layer 208 is deposited on the capping layer 206 in the chamber by a PECVD process. The PECVD process for depositing the first barrier layer 208 may include introducing a silicon-containing precursor and a nitrogen containing precursor into the PECVD chamber at a temperature of less than about 100 degrees Celsius.

In one embodiment, the first barrier layer 208 is SiON, and $SiH_4$, $N_2O$, $NH_3$, $N_2$, and $H_2$ gases are introduced into the chamber for depositing the SiON first barrier layer 208. The flow rate ratio of the $NH_3$ gas to the $SiH_4$ gas ranges from about 0.9 to 1.1, the flow rate ratio of the $N_2O$ gas to the $SiH_4$ gas ranges from about 15.5 to 16.5, the flow rate ratio of the $N_2$ gas to the $SiH_4$ gas ranges from about 8.4 to 8.5, the flow rate ratio of the $H_2$ gas to the total flow ratio ranges from about 0.13 to 0.16, and the flow rate ratio of the $N_2O$ gas to the total flow ratio ranges from about 0.23 to 0.36. The chamber pressure ranges from about 0.13 Torr to about 0.14 Torr, and a power density ranges from about 4.5 $mW/mm^2$ to about 6.5 $mW/mm^2$.

The buffer layer 210 is deposited over the first barrier layer 208 in the chamber by a PECVD process. A purge step is performed after depositing the first barrier layer 208 prior to depositing the buffer layer 210, because different precursors are being used for the deposition processes. After the buffer layer 210 is deposited, another purge step is performed. The second barrier layer 212 is deposited over the buffer layer 210, and the second barrier layer 212 may be deposited under the same process conditions as the first barrier layer 208.

Utilizing the TFE 214 having the first barrier layer 208 comprising SiON having a low refractive index of less than about 1.5, a low WVTR of less than about $5.0 \times 10^{-5}$ $g/m^2$/day, and low $H_2$ content of less than about 8% enables the first barrier layer 208 to be a reliable barrier layer in transparent or flexible display devices that are moisture sensitive, H bond sensitive, and/or OH bond sensitive devices. Additionally, the first barrier layer 208 having the above mentioned properties reduces the optical loss by about 10% as compared to silicon nitride films and helps prevent moisture and/or hydrogen diffusion from occurring within the display devices, further preventing the TFE 214 from failing.

Figure 3A:
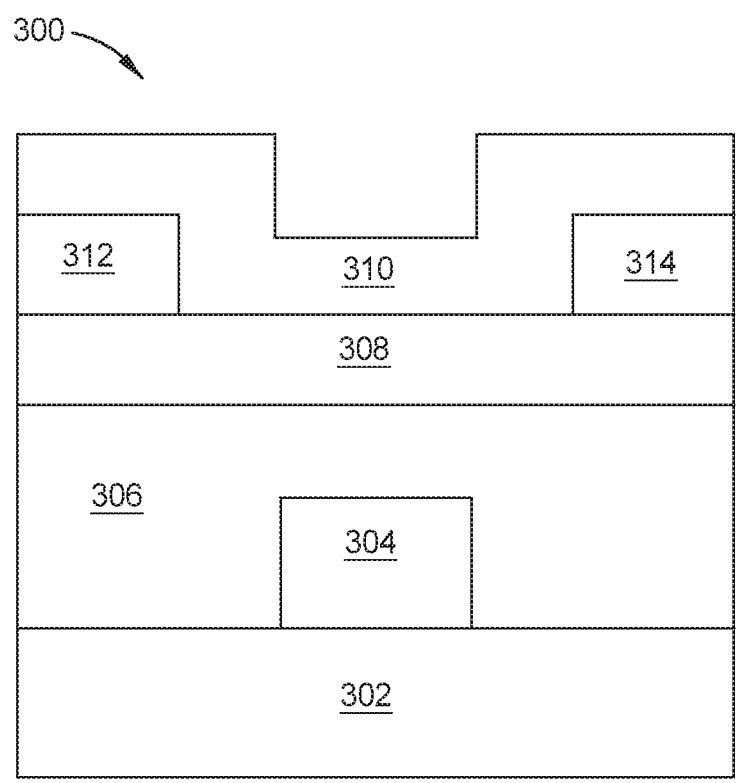
FIGS. 3A-3B illustrate schematic, cross sectional views of thin film transistors utilized in a display device, according to various embodiments.
Figure 3B:
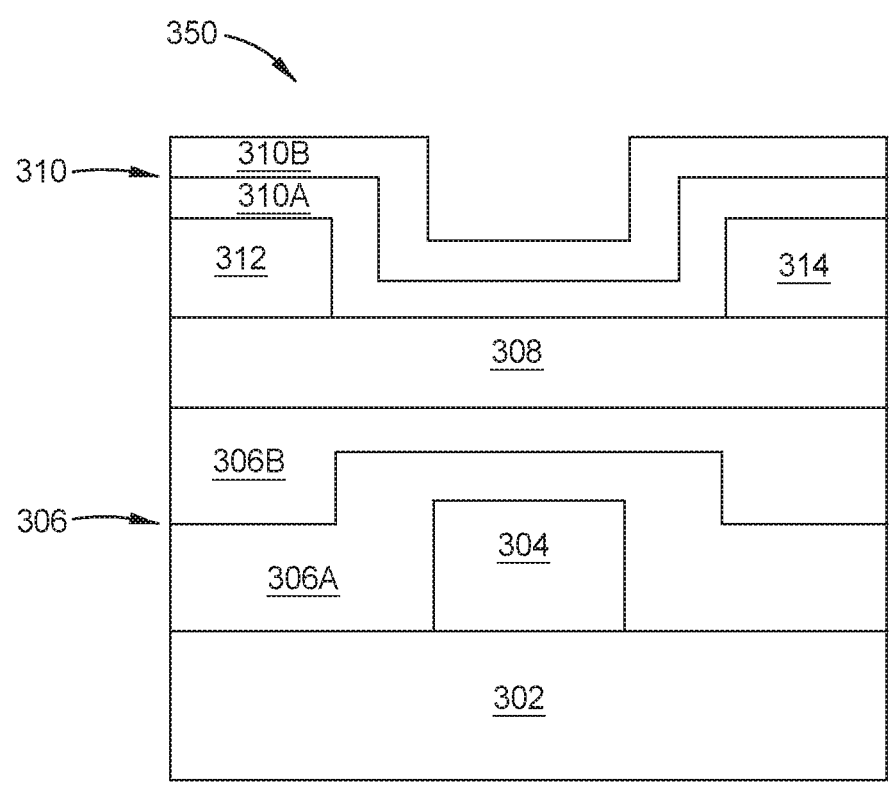

FIGS. 3A-3B are a schematic, cross sectional view of thin film transistors (TFT) 300, 350, respectively, utilized in a display device, according to various embodiments. The TFT 300 of FIG. 3A and the TFT 350 of FIG. 3B are the same; however the gate insulating layer 306 of the TFT 300 of FIG. 3A is a single layer while the gate insulating layer 306 of the TFT 350 of FIG. 3B is a dual layer, and the passivation layer 310 of the TFT 300 of FIG. 3A is a single layer while the passivation layer 310 of the TFT 350 of FIG. 3B is a dual layer. The TFT 300 of FIG. 3A and the TFT 350 of FIG. 3B each comprise a substrate 302. The substrate 302 may be made of a silicon-containing material, glass, polyimide, or plastic, such as PET or PEN. A gate electrode 304 is disposed on the substrate 302. The gate electrode 304 may comprise copper, tungsten, tantalum, aluminum, among others. A gate insulating layer 306 is disposed over the gate electrode 304 and the substrate 302.

A semiconductor layer 308 is disposed over the gate insulating layer 306. The semiconductor layer 308 may comprise a metal oxide semiconductor material, a metal oxynitride semiconductor material, such as indium gallium zinc oxide (IGZO), or silicon, such as amorphous silicon, crystalline silicon, and polysilicon, among others. A drain electrode 312 and a source electrode 314 are disposed on the semiconductor layer 308. The drain electrode 312 is spaced from and adjacent to the source electrode 314. The drain electrode 312 and the source electrode 314 may each comprise copper, tungsten, tantalum, aluminum, among others. A passivation layer 310 is disposed over the semiconductor layer 308, the drain electrode 312, and the source electrode 314. The passivation layer 310 and the gate insulating layer 306 are moisture barrier films or layers.

The passivation layer 310 and the gate insulating layer 306 may each individually comprise the same material as the first barrier layer 208 of FIG. 2. The passivation layer 310 and/or the gate insulating layer 306 are at least partially comprised of a material comprising silicon oxynitride (SiON). The SiON material of the passivation layer 310 and/or the gate insulating layer 306 has a refractive index at 632 nm of less than about 1.5, such as about 1.46 to about 1.48, and a WVTR of less than about $5.0 \times 10^{-5}$ $g/m^2$/day at 40 degrees Celsius and a relative humidity of 100%. The SiON material of the passivation layer 310 and/or the gate insulating layer 306 has a composition by XPS of about 1.70 to about 2.15 of O/Si and about 0.01 to about 0.05 of N/Si. The SiON material of the passivation layer 310 and/or the gate insulating layer 306 further has a density by XPS of about 2.15 $g/cm^3$ to about 2.20 $g/cm^3$. The SiON material of the passivation layer 310 and/or the gate insulating layer 306 has a Si—O—Si peak position of about 1050 $cm^{-1}$ to about 1080 $cm^{-1}$ when measured by FTIR. Additionally, the SiON material of the passivation layer 310 and/or the gate insulating layer 306 has a thickness change percentage of about 104% to about 106% at 85 degrees Celsius and a relative humidity of 85% (i.e., saturated).

The SiON material of the passivation layer 310 and/or the gate insulating layer 306 has a composition by HFS of hydrogen of about less than 8%. In one embodiment, the SiON material of the passivation layer 310 has a composition by HFS of hydrogen of about less than 6%, and the SiON material of the gate insulating layer 306 has a composition by HFS of hydrogen of about less than 5%. The passivation layer 310 and the gate insulating layer 306 may each comprise the SiON material having the above described properties and composition, or only one of the passivation layer 310 or the gate insulating layer 306 may comprise the SiON material having the above described properties and composition, FIG. 3A illustrates a single layer gate insulating layer 306 and a single layer passivation layer 310. The single layer gate insulating layer 306 and the single layer passivation layer 310 may each individually comprise SiON. FIG. 3B illustrates a dual layer gate insulating layer 306 and a dual layer passivation layer 310. In the TFT 350 of FIG. 3B, the gate insulating layer 306 comprises a layer comprising SiON 306A and a layer comprising silicon oxide (SiOx) 306B. The layer comprising SiON 306A of the gate insulating layer 306 is disposed on and in contact with the substrate 302 and the gate electrode 304. The layer comprising SiOx 306B of the gate insulating layer 306 is disposed between and in contact with the dielectric layer 308 and the layer comprising SiON 306A. The passivation layer 310 of the TFT 350 of FIG. 3B comprises a layer comprising SiOx 310A and a layer comprising SiON 310B. The layer comprising SiOx 310A of the passivation layer 310 is disposed on the dielectric layer 308, the drain electrode 312, and the source electrode 314. The layer comprising SiON 310B of the passivation layer 310 is disposed on the layer comprising SiOx 310A.

The passivation layer 310 and the gate insulating layer 306 may be formed by the same PECVD process as the first barrier layer 208 of FIG. 2. In some embodiments, the passivation layer 310 and the gate insulating layer 306 may be formed by a CVD or ALD process. The PECVD process for depositing the passivation layer 310 and/or the gate insulating layer 306 may include introducing a silicon-containing precursor and a nitrogen containing precursor into a PECVD chamber, such as the chamber 100 of FIG. 1. In some embodiments, the passivation layer 310 is deposited at a temperature of less than about 300 degrees Celsius and the gate insulating layer 306 is deposited at a temperature of less than about 100 degrees Celsius. In one embodiment, the passivation layer 310 and the gate insulating layer 306 are each SiON, and $SiH_4$, $N_2O$, $NH_3$, $N_2$, and $H_2$ gases are introduced into the chamber for depositing the SiON passivation layer 310 and the SiON gate insulating layer 306. The gate insulating layer 306 is deposited first, followed by the semiconductor layer 308, followed by the passivation layer 310. The chamber may be purged between each layer deposition.

For both the passivation layer 310 and the gate insulating layer 306, the flow rate ratio of the $NH_3$ gas to the $SiH_4$ gas ranges from about 0.9 to 1.1, the flow rate ratio of the $N_2O$ gas to the $SiH_4$ gas ranges from about 15.5 to 16.5, the flow rate ratio of the $N_2$ gas to the $SiH_4$ gas ranges from about 8.4 to 8.5, the flow rate ratio of the $H_2$ gas to the total flow ratio ranges from about 0.13 to 0.16, and the flow rate ratio of the $N_2O$ gas to the total flow ratio ranges from about 0.23 to 0.36. The chamber pressure ranges from about 0.13 Torr to about 0.14 Torr, and a power density ranges from about 4.5 $mW/mm^2$ to about 6.5 $mW/mm^2$.

Utilizing the TFTs 300, 350 having the passivation layer 310 and/or the gate insulating layer 306 comprising SiON having a low refractive index of less than about 1.5, a low WVTR of less than about $5.0 \times 10^{-5}$ $g/m^2/day$, and low $H_2$ content of less than about 8% enables the passivation layer 310 and/or the gate insulating layer 306 to be reliable barrier layers in transparent or flexible display devices that are moisture sensitive, H bond sensitive, and/or OH bond sensitive devices. The passivation layer 310 and/or the gate insulating layer 306 having the above mentioned properties reduce the optical loss by about 10% as compared to silicon nitride films and help prevent moisture and/or hydrogen diffusion from occurring within the display devices, further preventing the characteristics of the TFTs 300, 350 from shifting undesirably.

Moreover, utilizing the passivation layer 310 and/or the gate insulating layer 306 having a low refractive index of less than about 1.5, a low WVTR of less than about $5.0 \times 10^{-5}$ $g/m^2/day$, and low $H_2$ content of less than about 8% results in less change in positive bias temperature stress, negative bias temperature stress, and negative bias temperature illumination stress. As such, the passivation layer 310 and/or the gate insulating layer 306 having the above mentioned properties enable better bias stability and lower turn-on voltages when integrated into the TFTs 300, 350.

Therefore, utilizing a moisture barrier film as a first barrier layer in a TFE or as a passivation layer and/or a gate insulating layer in a TFT comprising SiON having a low refractive index of less than about 1.5, a low WVTR of less than about $5.0 \times 10^{-5}$ $g/m^2/day$, and low $H_2$ content of less than about 8% enables the layers to be reliable barrier layers in transparent or flexible display devices that are moisture sensitive, H bond sensitive, and/or OH bond sensitive devices. Additionally, the moisture barrier layers each having the above mentioned properties reduce the optical loss by about 10% as compared to silicon nitride films and help prevent moisture and/or hydrogen diffusion from occurring within the display devices, further preventing TFEs from failing and preventing the characteristics of TFTs from shifting undesirably.

While the foregoing is directed to embodiments of the present disclosure, other and further embodiments of the disclosure may be devised without departing from the basic scope thereof, and the scope thereof is determined by the claims that follow.

What is claimed is:

1. A thin film encapsulation structure, comprising:
   a first barrier layer, the first barrier layer comprising a first silicon oxynitride material having a refractive index of about 1.46 to about 1.48, a water vapor transmission rate of less than about $5.0 \times 10^{-5}$ $g/m^2/day$, and a hydrogen content of less than about 8%;
   a buffer layer disposed on the first barrier layer, wherein the buffer layer comprises hexamethyldisilazane (HMDSN); and
   a second barrier layer disposed on the buffer layer, the second barrier layer comprising a second silicon oxynitride material.

2. The thin film encapsulation structure of claim 1, wherein the second silicon oxynitride material is the same as the first silicon oxynitride material.

3. The thin film encapsulation structure of claim 1, wherein the second silicon oxynitride material is different from the first silicon oxynitride material.

4. The thin film encapsulation structure of claim 1, wherein the first barrier layer has a thickness of about 0.5 micrometers to about 3 micrometers.

5. The thin film encapsulation structure of claim 1, wherein
   the first silicon oxynitride material has a thickness change percentage of about 104% to about 106% at 85 degrees Celsius and a relative humidity of 85%.

6. A thin film transistor, comprising:
   a gate electrode;
   a gate insulating layer comprising:
      a first silicon oxynitride material disposed on the gate electrode, the first silicon oxynitride material having a refractive index of less than about 1.46 to about 1.48, a water vapor transmission rate of less than about $5.0 \times 10^{-5}$ $g/m^2/day$, a density of about 2.15 $g/cm^3$ to about 2.20 $g/cm^3$, a composition of about 0.01 to about 0.05 of N/Si, and a hydrogen content of less than about 6%; and
      a first silicon oxide material disposed directly on the first silicon oxynitride material:
   a semiconductor layer disposed on the first silicon oxide material of the gate insulating layer;
   a drain electrode disposed on the semiconductor layer;
   a source electrode disposed on the semiconductor layer, adjacent to the drain electrode; and a passivation layer comprising:
    a second silicon oxide material disposed on the drain electrode, the source electrode, and the semiconductor layer; and
    a second silicon oxynitride material disposed directly on the second silicon oxide material.

7. The thin film transistor of claim 6, wherein the second silicon oxynitride material has a refractive index of about 1.46 to about 1.48, a water vapor transmission rate of less than about $5.0 \times 10^{-5}$ g/m²/day, and a hydrogen content of less than about 6%.

8. The thin film transistor of claim 7, wherein
the passivation layer is deposited by a plasma enhanced chemical vapor deposition process at temperature of less than about 300 degrees Celsius.

9. A display device, comprising:
a light emitting device;
a capping layer disposed over the light emitting device; and
a thin film encapsulation structure disposed over the capping layer, the thin film encapsulation structure comprising:
    a first barrier layer disposed over the capping layer, the first barrier layer comprising a first silicon oxynitride material having a refractive index of about 1.46 to about 1.48, a water vapor transmission rate of less than about $5.0 \times 10^{-5}$ g/m²/day, and a hydrogen content of less than about 8%;
    a buffer layer disposed on the first barrier layer, wherein the buffer layer comprises hexamethyldisilazane (HMDSN); and
    a second barrier layer disposed on the buffer layer, the second barrier layer comprising a second silicon oxynitride material.

10. The display device of claim 9, wherein
the light emitting device is an organic light emitting diode device, or
the second silicon oxynitride material is the same as the first silicon oxynitride material.

11. The display device of claim 9, wherein the first silicon oxynitride material has a thickness change percentage of about 104% to about 106% at 85 degrees Celsius and a relative humidity of 85%.

12. The thin film encapsulation structure of claim 1, wherein the first silicon oxynitride material has a Si—O—Si peak position of about 1050 cm$^{-1}$ when measured by Fourier-transform infrared spectroscopy.

13. The thin film encapsulation structure of claim 4, where a total thickness of the first barrier layer, the buffer layer, and the second barrier layer is from about 2 micrometers to about 10 micrometers.

14. The thin film encapsulation structure of claim 13, wherein the buffer layer has thickness of about 2 micrometers to about 5 micrometers.

15. The thin film encapsulation structure of claim 14, wherein the second barrier layer has a thickness of about 0.5 micrometers to about 3 micrometers.

16. The thin film transistor of claim 7, wherein the first silicon oxynitride material has a thickness change percentage of about 104% to about 106% at 85 degrees Celsius and a relative humidity of 85%.

17. The thin film transistor of claim 6, wherein the first silicon oxynitride material is the same as the second silicon oxynitride material.

18. The thin film transistor of claim 6, wherein the first silicon oxynitride material is different from the second silicon oxynitride material.

19. The display device of claim 9, wherein the first silicon oxynitride material has a Si—O—Si peak position of about 1050 cm$^{-1}$ when measured by Fourier-transform infrared spectroscopy.

* * * * *